United States Patent [19]

Arques et al.

[11] Patent Number: 4,654,816

[45] Date of Patent: Mar. 31, 1987

[54] OUTPUT COMPENSATION FOR CHARGE TRANSFER DEVICES

[75] Inventors: Marc Arques, Grenoble; Jacques Portmann, St. Egreve, both of France

[73] Assignee: Thomson-CSF, Paris, France

[21] Appl. No.: 621,035

[22] Filed: Jun. 15, 1984

[30] Foreign Application Priority Data

Jun. 28, 1983 [FR] France ................................ 83 10679

[51] Int. Cl.$^4$ ........................ G06G 7/00; H04N 5/228; H04N 5/335

[52] U.S. Cl. .................................... 364/862; 358/213; 358/221

[58] Field of Search ................ 364/862; 358/167, 213, 358/221; 250/334, 338

[56] References Cited

U.S. PATENT DOCUMENTS

| | | | |
|---|---|---|---|
| 3,949,162 | 4/1976 | Malueg | 178/7.1 |
| 4,001,502 | 1/1977 | van Roessel | 358/221 |
| 4,225,883 | 9/1980 | Van Atta | 358/338 |
| 4,317,134 | 2/1982 | Nea-Yea Woo | 358/213 |
| 4,345,148 | 8/1982 | Pines | 250/214 |

*Primary Examiner*—L. A. Goldberg
*Assistant Examiner*—Mark Reinhart
*Attorney, Agent, or Firm*—Roland Plottel

[57] ABSTRACT

The present invention concerns a process for correcting the output level of a charge-transfer device, as well as a device for operating the same. Said process comprises different steps, respectively a first step where the quantities of charges corresponding to a reference signal that are stored in N stages are read successively and the values being function of the different quantities of charges read, are stored in a memory; and a second step, where before each read-out of a charges quantity, the precharge level of the output stage is modulated in function of the value of the same rank stored in the memory.

5 Claims, 6 Drawing Figures

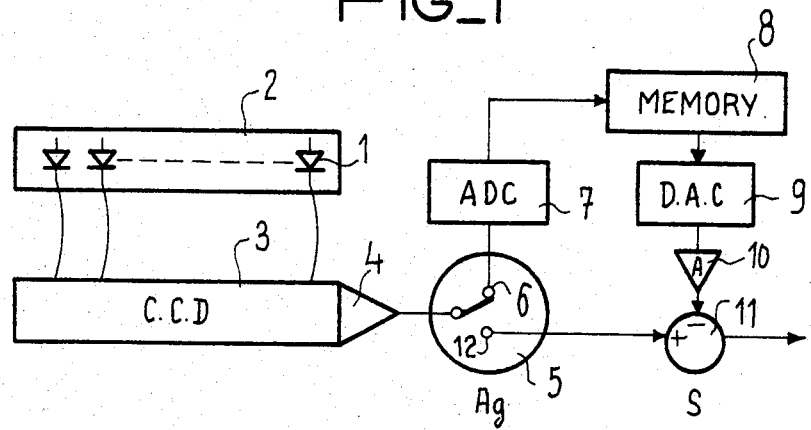
PRIOR ART FIG_1
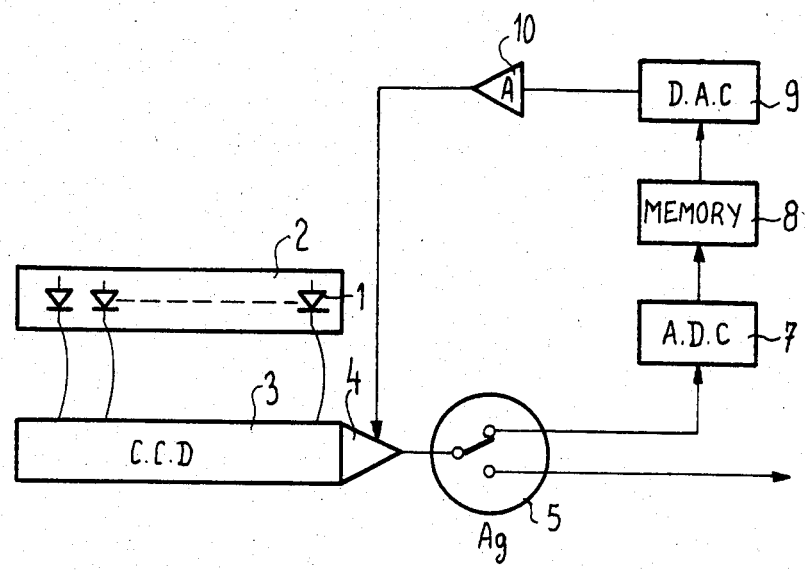
FIG_4

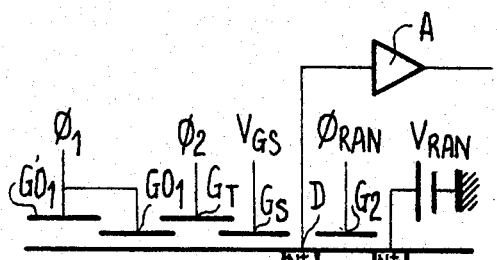
FIG_2-a
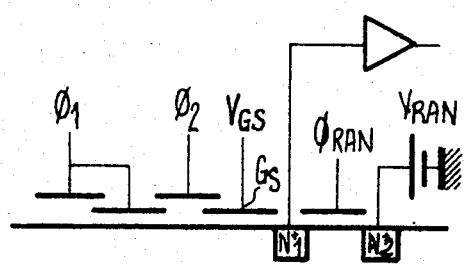
FIG_2-b
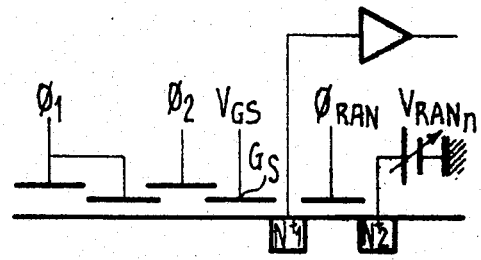
FIG_3-a
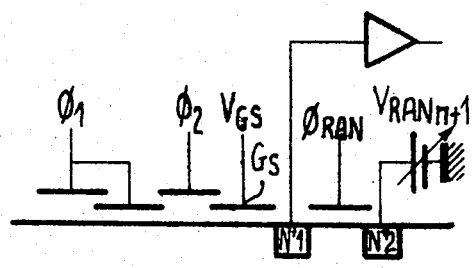
FIG_3-b

OUTPUT COMPENSATION FOR CHARGE TRANSFER DEVICES

BACKGROUND OF THE INVENTION

1. Field of the Invention

The present invention concerns a process for correcting the output level of a charge-transfer device, as well as a device for operating the same.

This correction process, which consists in equalizing the output level of a charge-transfer device for uniform input signals, can be used on any charge-transfer device. It is, however more particularly interesting when the charge-transfer device is used for multiplexing photodiodes, especially in the infrared field. Indeed, in this case the photodiodes are formed of materials such as cadmium and mercury telluride, tin and lead telluride or indium antimonide. However, with these types of materials, it is difficult to obtain photodiodes all presenting the same characteristics. This means that the photodiodes have responses to lighting that are very often inhomogeneous. Since these inhomogeneities are much higher than the minimum response deviation that it is desired to be able to detect on photodiodes, their compensation is thus essential. Among these inhomogeneities, one of them concerns the output level that can be observed when the photodiodes are illuminated by an uniform temperature scene.

2. Description of the Prior Art

Different processes have been used to correct this type of inhomogeneities. According to a process of the prior art, in a first step the photodiodes are illuminated with an uniform temperature scene or reference background. The data read at the output of the charge-transfer device used for the multiplexing of the photodiodes, is sent after digital conversion into a memory in which, for each stage of the charge-transfer device, data corresponding to the inhomogeneities is stored. In a second step, the photodiodes are illuminated by the scene to be observed. The data read in the output of the charge-transfer device is sent to a subtractor through which is corrected the output signal corresponding to each photodiode by subtracting the corresponding inhomogeneity value stored in the memory after it has been reconverted into an analogical form through the intermediary of a digital-to-analogue converter.

SUMMARY OF THE INVENTION

The present invention concerns a novel process for the correction of the output level of a charge-transfer device that can be used in the case where the read-out of the charges is realized by using a precharge level.

This novel process permits, in particular, to suppress the subtractor necessary for operating the process according to the prior art; this allows a simplification of the output electronics of the charge-transfer device.

The process according to the present invention used for the correction of the output level of a charge-transfer device of N stages connected to an output stage effecting read-out of the charges by using a precharge level, is characterized in that:

in a first step, the precharge level being fixed quantities of charges corresponding to a reference signal that are stored in said N stages are read successively and values being function of said quantities of charges read are stored in a memory, in a second step, before each read-out of a charges quantity, the precharge level of the output stage is modulated in function of the value of the same rank stored in the memory in such a way as to obtain for a reference signal a constant value.

BRIEF DESCRIPTION OF THE DRAWINGS

Other characteristics and advantages of the present invention will appear from reading the description of different embodiments given herein-below with reference to the annexed drawings in which:

FIG. 1 is a schematic representation of a correction device used in the process of the prior art;

FIGS. 2-$a$ and 2-$b$ are schematic representations of an output stage of a charge-transfer device and of surface potentials in the substrate on which is integrated the read-out stage in the case of reading charges $Q_n$ and $Q_{n+1}$ when the precharge level is steady;

FIGS. 3-$a$ and 3-$b$ are similar views to those of FIGS. 2-$a$ and 2-$b$ when the precharge level is controlled according to the process of the present invention;

FIG. 4 is a schematic representation of the correction device used with the process of the present invention.

DESCRIPTION OF THE PREFERRED EMBODIMENT

On the different figures the same reference numbers designate the same elements but for enhanced clarity the sizes and the proportions of the various elements have not been respected.

FIG. 1 represents schematically a photosensitive device used in the infrared field as well as a device for correction of the continuous output level used for operating the process of the prior art. In a manner know per se, the photosensitive device is principally constituted by photodetectors that, in the embodiment represented, are constituted by photodiodes 1 formed on a substrate 2 that can be constituted by cadmium and mercury telluride, tin and lead telluride or indium antimonide. The photodiodes are connected through the intermediary of a transition zone (not represented) to a read-out device constituted by a charge-transfer shift register 3 with N parallel inputs and a series output and by an output stage 4. The transition zone and the read-out device are realized, in this particular case, on an independent substrate, preferably made of p-type silicon or of an equivalent material. The correction device itself, foreseen at the output of the reading stage 4 comprises among others a switch 5. One of the terminals 6 of the switch is connected to an analogue-to-digital converter 7, itself connected to a memory 8. The output of the memory 8 is connected through the intermediary of a digital-to-analogue converter 9 and an amplifier 10 to the negative terminal of a subtractor 11 of which the positive terminal is connected to the second terminal 12 of the switch 5.

According to the process of the prior art, in a first step the photodiodes are lit by a uniform reference temperature. The detected charges are sent towards the shift register 3 and read by the output stage 4. In this case, the switch is positioned on the terminal 6 and the output data is sent to the analogue-to-digital converter 7 where it is transformed into digital data that is thus stored in the memory 8. This data is representative of the inhomogeneities due to the photodiodes 1. In a second time the photodiodes 1 are no longer lit by a uniform temperature or reference background but by the scene to be observed. In this case, the input terminal of the switch 5 is connected to the output terminal 12.

Due to this fact, the output signal is sent to the subtractor 11. In this subtractor the output signal is corrected by subtracting from it the values corresponding to the inhomogeneities of the same rank that have been stored in the memory 8 after having brought them into analogical form through the intermediary of a digital-to-analogue converter 9. The amplifier 10 permits to adjust to 1 the gain of the analogue-to-digital converter, memory and digital-to-analogue converter assembly.

The process for correcting the output level of a charge-transfer device according to the present invention will now be described with particular reference to FIGS. 2-a, 2-b, 3-a and 3-b. In the upper part of these different figures, a section of the essential elements of the output stage of the shift register has been schematically represented. On these figures, the reference $G_{01}$ designates the storage electrode of the last stage of the shift register 3. This storage electrode is connected upstream to a transfer electrode $G'_{01}$ disposed, in the embodiment represented, on an overthickness of oxide. The transfer electrode $G'_{01}$ and the storage electrode $G_{01}$ are both connected to the same potential $\Phi_1$. Between the storage electrode $G_{01}$ and the input of the output stage per se is provided a transfer electrode $G_T$ connected to the potential $\Phi_2$. The potentials $\Phi_1$ and $\Phi_2$ are constituted, for example, by square shaped voltages in phase opposition. By way of example a shift register with two control phases and oxide overthickness in order to render the transfer unilateral has been chosen. It is obvious for the man skilled in the art that the invention can be applied to other types of shift register.

In the embodiment represented, a destructive read-out is effected on a floating diode. Due to this fact, the output stage comprises principally a diode D realized by a n type diffusion referenced $N+1$ when the substrate is formed of p type silicon. This diffusion is connected to a read-out stage that can be constituted by a follower MOS transistor symbolized by amplifier A. In order to increase the storage capacity of the diode, a storage electrode $G_S$ brought to a direct voltage $V_{GS}$ can be placed between transfer gate $G_T$ and diode D.

On the other hand, the output stage also comprise a reset MOS transistor constituted by the gate $G_2$ polarized by the potential $\Phi_{RAN}$. The drain of the MOS transistor is realized by a n type diffusion, referenced $N+2$, connected to a polarization voltage $V_{RAN}$ and the source is constituted by the diode D.

The evolution of the surface potentials under the diode D, i.e. the origin of the differences of potential at the output when the polarization voltage $V_{RAN}$ is steady will now be explained. This case corresponds to the first step of the process of the present invention as well as to the process of the prior art and permits to read at the output the quantities of charges corresponding to the inhomogeneities of the different photodiodes. As represented in FIGS. 2-a and 2-b, when the photodiodes are lit by the reference background, a quantity of charges $Q_n$ corresponding to a voltage variation $\Delta V_n$ is first of all read, then a quantity of charges $Q_{n+1}$ corresponding to a voltage variation $\Delta V_{n+1}$ is read, this later being more important in the embodiment represented due to the inhomogeneities which are present. The voltage variations $\Delta V_n$ and $\Delta V_{n+1}$ are different. This means that the voltage $V_n$ and $V_{n+1}$ read by the follower amplifier A that are representative of the data at the output, i.e. of the inhomogeneities, are different and that different data for each stage, i.e. each photodiode, are thus stored in memory 8.

If the polarization voltage $V_{RAN}$ is maintained constant as in the process according to the prior art, during the read-out of a scene, the variations of potential due to the modifications of temperature of the scene will be added to the variations of potential due to the inhomogeneities and therefore the correction of the output level will have to be carried out at the output by subtraction of the values stored in the memory, in order to recover the values corresponding to the scene.

According to the present invention, instead of carrying out correction of the inhomogeneities at the output of the read-out stage, the correction is realized at the level of the output stage by causing to vary its precharge level, i.e. by causing to vary the polarization voltage $V_{RAN}$ in such a way that the potentials $V_n$, $V_{n+1}$ due to the inhomogeneities are constant during the read-out of the scene. Therefore, as represented in FIGS. 3-a and 3-b, prior to reading the charges quantity $Q_n$ the voltage $V_{RAN}$ is modified into a voltage $V_{RANn}$ obtained by adding to a steady voltage V the value $\Delta V_n$ stored during the reading realized when the photodiodes were illuminated by a uniform temperature. Due to this fact, during the read-out of charges $Q_n$, a difference of potential $\Delta V_n$ is observed that, once subtracted from $V_{RANn}$ gives the voltage $V_n$. Once the read-out of the charges $Q_n$ is realized, the reset and the precharge of the output stage are carried out by modifying the voltage $V_{RANn}$ to the value $V_{RANn+1}$, obtained in a similar way by adding to the steady voltage V the value $\Delta V_{n+1}$ stored in the storage memory 8 during the prior read-out. Due to this fact, by modifying the precharge voltage $V_{RAN\ n}$, $V_{RAN\ n+1}$ a single final level $V_n = V_{n+1}$, as represented in FIGS. 3-a and 3-b can be obtained, despite the voltage variations corresponding to the inhomogeneities.

Therefore, by modifying the reset voltage with the use of representative values of the inhomogeneities stored in the memory, it is possible to suppress the subtractor used in the output level correction process of a charge transfer shift register of the prior art.

FIG. 4 shows the device used at the output of the output stage 4 with the process according to the present invention comprising a switch 5, the terminal 6 of which is connected to an analogue-to-digital converter 7 itself connected to a memory 8. The memory is connected to a digital-to-analogue converter 9 that is connected through the intermediary of the amplifier 10 to the reset voltage of the output stage 4. The other terminal 7 of the switch 5 gives directly the image analysis signal without subtractor, due to this face, the bulk of the device is decreased and the energy consumption of the system assembly is reduced.

Furthermore, it will be noted that the noise on the corrected signal will be the same as that on the non corrected signal if the noise on $V_{RAN}$ is negligible compared to other noises. Indeed, according to the present invention, the precharge level of the capacity of the output level is modulated, and the precharge noise of a capacity is not dependant upon the precharge voltage.

What is claimed is:

1. A method for compensating the output level of a charge-transfer device, the device having N stages connected to an output stage and producing a read-out of the charges relative to a reference precharge level, wherein:

in a first step the precharge level being fixed, quantities of charges stored in said N stages as a result of an application of a reference signal are read successively and values representative of said quantities of charges read are stored in a memory;

then, in a second step before the read-out of the charge at each stage, the precharge level of the output stage is modifed dependent upon the valve stored in the memory corresponding to that stage in such a way as to produce a constant level output for each stage upon application of said reference signal and hence compensates for response variation between the stages.

2. A method according to claim 1, wherein the modification of the precharge level is obtained by modifying the reset voltage of the charge transfer device.

3. Apparatus for carrying out the process claim 1 including a charge transfer device having a plurality of stages and an output stage having a reset voltage terminal, a switch and a memory, the switch being connected to the output stage of the charge transfer device, and selectably switchable to the input of the memory, and the output of the memory being supplied to the reset voltage terminal of the charge transfer device.

4. A process which compensates for inhomogeneities in a plurality of photoelements whose outputs are supplied as inputs to a charge transfer device which is characterized by a like plurality of input stages and by a single output stage for serial readout the level of the output stage being a function of the precharge level of the output stage at the time of readout comprising:

illuminating the photoelements uniformly and supplying their respective outputs to said charge transfer device for readout with a fixed precharge level on the output stage, storing a measure of the respective outputs corresponding to successive photoelements separately in a memory, and thereafter after illuminating the photodiodes with an image scene and transfer of the outputs to the charge transfer device for readout, adjusting the precharge level of the output stage during readout of successive stages in accordance with the stored measure of the photodiode corresponding to such stage.

5. Apparatus for carrying out the process of claim 4 comprising a plurality of photoelements, a charge transfer device having a plurality of input stages each supplied with a respective one of the plurality of photoelements, the charge transfer device including an output stage which is controlled by the voltage applied thereto for setting its precharge level and memroy means for storing separately a measure of the characteristics of each photoelement, and means supplied with said memory for setting the voltage at the output stage of the charge transfer device in accordance with the stored meansure of a particular photoelement during readout of such photoelement.

* * * * *